United States Patent [19]

Motohashi

[11] Patent Number: 4,866,352
[45] Date of Patent: Sep. 12, 1989

[54] DISPLAY CIRCUIT OF AN OSCILLOSCOPE

[75] Inventor: Fumihiko Motohashi, Shakujii, Japan

[73] Assignee: Iwatsu Electric Co., Ltd., Tokyo, Japan

[21] Appl. No.: 147,905

[22] Filed: Jan. 25, 1988

[30] Foreign Application Priority Data

Feb. 12, 1987 [JP] Japan .................................. 62-30280

[51] Int. Cl.$^4$ ........................ G06K 15/20; H01J 31/16
[52] U.S. Cl. ..................................... 315/365; 340/736
[58] Field of Search ....................... 315/365, 396, 397; 340/732, 736, 748

[56] References Cited

U.S. PATENT DOCUMENTS

3,859,557  1/1975  Grant et al. ........................... 315/365
4,225,940  9/1980  Moriyasu et al. .................... 315/367
4,631,454 12/1986  Ballard ................................. 315/408

Primary Examiner—Theodore M. Blum
Attorney, Agent, or Firm—Oblon, Spivak, McClelland, Maier & Neustadt

[57] ABSTRACT

A display circuit of an oscillscope to switchingly display waveforms and characters has substantially no fluctuation phenomena caused by switching waveforms and characters. Each driving amplifier for waveforms and characters is employed to drive a final stage amplifier of which outputs are applied to deflection plates of a CRT. As a driving amplifier is not used in common to amplify waveforms and characters, clear waveforms and characters are observable without fluctuations.

4 Claims, 5 Drawing Sheets

DISPLAY CIRCUIT OF AN OSCILLOSCOPE

BACKGROUND OF THE INVENTION

1. Field of the invention

This invention relates generally to a display circuit of an oscilloscope in which a cathode-ray tube (CRT) is employed.

An oscilloscope is used in order to observe various signal waveforms. On a surface of a display of the oscilloscope, not only waveforms but also characters, which show various data for observation, are simultaneously displayed. This invention relates more particularly to a display circuit to deflect a CRT of such an oscilloscope.

2. Description of the Prior Art

Figure 1:
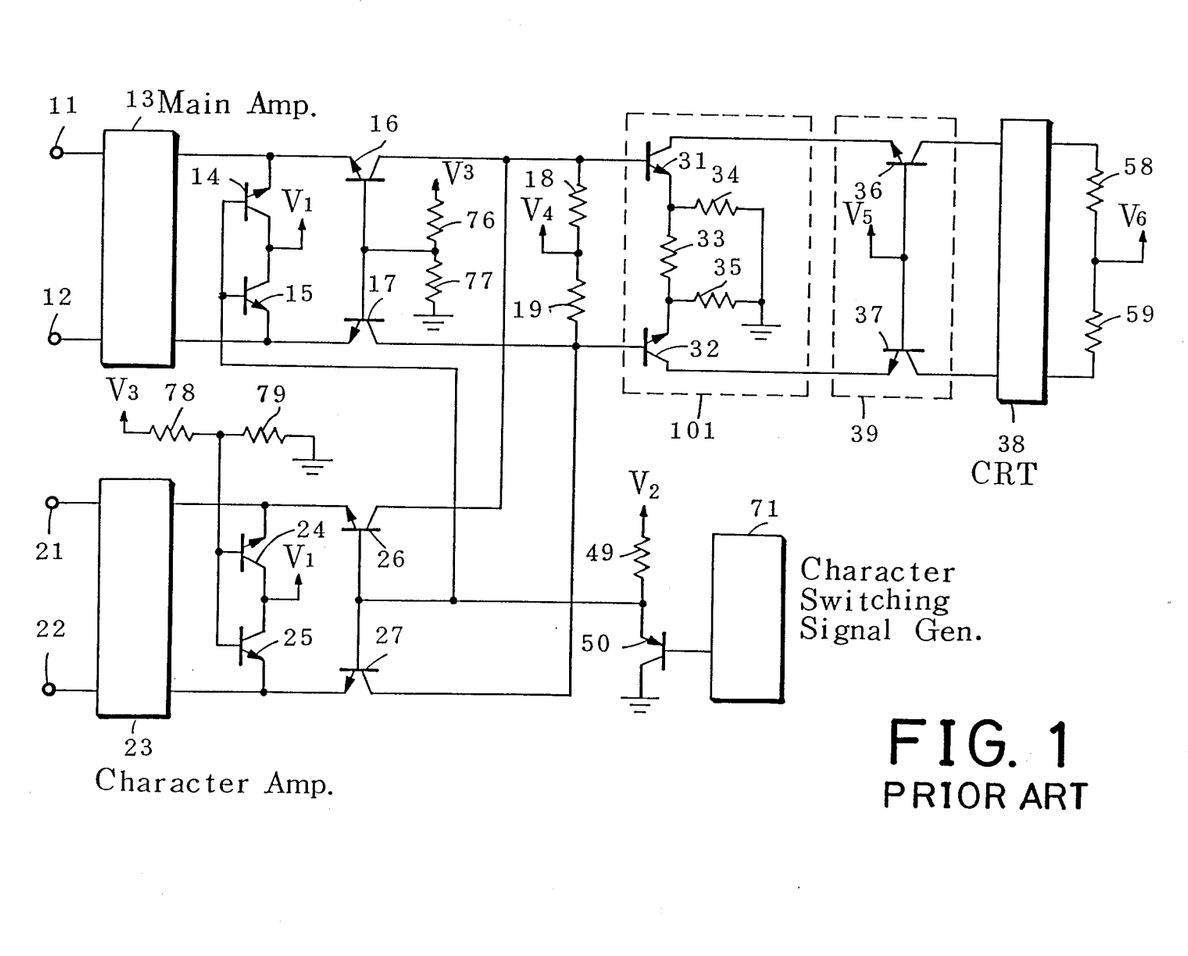
FIG. 1 is a circuit diagram showing a prior art.

The prior art of a circuit to display signal waveforms to be observed and characters is shown in FIG. 1.

Numerals 11 and 12 indicate signal input terminals. Each signal input terminal of 11 and 12 is applied a signal of a polarity reverse to each other from a prestage amplifier which is not shown in FIG. 1.

Numeral 13 identifies a main amplifier which amplifies signals from input terminals 11 and 12. The amplified signals are amplified to bases of transistors 31 and 32 via transistors 16 and 17. Numerals 18 and 19 denote load resistors connected to a power supply $V_4$ for the main amplifier 13 and transistors 16 and 17 which form the common-base circuit.

Base of the transistors 16 and 17 are connected together to biasing resistors 76 and 77 which divide a voltage of a power supply $V_3$. Transistors 31 and 32 and resistors 33, 34 and 35 construct a driving amplifier 101 in the common-emitter connection. Transistors 36 and 37 in the common-base connection form a final stage amplifier 39 of a balanced type. The final stage amplifier 39 is driven by the driving amplifier 101.

The resistor 33 is connected between emitters of transistors 31 and 32. The resistors 34 and 35 are respectively connected between emitters of transistors 31, 32 and the ground. The signal applied between bases of transistors 31 and 32 is amplified to be added to deflection plates (not shown) of the CRT 38 through the final stage amplifier consists of transistors 36 and 37 so that signal waveforms are displayed on the CRT 38. Numerals 58 and 59 designate load resistors of the driving amplifier 101 and the final stage amplifier 39. The resistors 58 and 59 are connected to a power supply $V_6$. Bases of transistors 36 and 37 are connected together to a power supply $V_5$ in order to be applied a bias voltage.

Emitters of transistors 14 and 15 are connected between emitters of transistors 16 and 17 which are connected to outputs of the main amplifiers 13, in which collectors of transistors 14 and 15 are connected together to a power supply $V_1$. Bases of transistors 14 and 15 connected together are applied a character switching signal.

Numerals 21 and 22 indicate character input terminals. Each terminal 21 and 22 is applied a character signal of a polarity reversed to each other from a character signal generator which is not shown in FIG. 1.

Numeral 23 identifies a character amplifier which amplifies the character signal from character input terminals 21 and 22. The character signal amplified by the character amplifier 23 is applied to bases of transistors 31 and 32 of the driving amplifier 101 through transistors 26 and 27 which form the common-base circuit. Load resistors of the character amplifier 23 are resistors 18 and 19 which are used in common as load resistors of the main amplifier 13.

The signal applied between bases of transistors 31 and 32 is amplified to be added deflection plates of the CRT 38 through transistors 36 and 37 so that characters are displayed on the CRT 38. Emitters of transistors 24 and 25 are respectively connected to emitters of transistors 26 and 27 which form the common-base circuit. Collectors of transistors 24 and 25 are connected together to the power supply $V_1$. Bases of transistors 24 and 25 connected together are applied a bias voltage obtained by resistors 78 and 79 dividing the voltage of the power supply $V_3$.

Bases of transistors 26 and 27 are connected together to bases of transistors 14 and 15 and an emitter of a transistor 50 which forms an emitter follower with resistor 49.

A switching signal is applied from a character switching signal generator 71 to the base of the transistor 50 forming the emitter follower. The character switching signal generator 71 generates a signal which is synchronized with a timing signal applied from a character signal generator not shown in FIG. 1. The switching signal applied to the base of the transistor 50 has two levels of "H" and "L".

Base voltages respectively applied to transistors 16, 17 and 24, 25 are set a voltage which is nearly center in levels of "H" and "L" for switching signal.

When the switching signal shows a level of "H", the base voltage of transistors 14 and 15 become higher than the base voltage of transistors 16 and 17, so that transistors 14 and 15 are turned on.

Transistors 16 and 17 are, therefore, turned off and the signal from the main amplifier 13 is not applied to bases of transistors 31 and 32. On the other hand, base voltage of transistors 26 and 27 becomes higher than base voltage of transistors 24 and 25 so that transistors 24 and 25 are turned off. Transistors 26 and 27 are, therefore, turned on to allow flow of their collector currents. The signal amplified by the character amplifier 23 is applied to bases of transistors 31 and 32. The signal is further amplified by the final stage amplifier 39 to display characters on the CRT 38.

When the output of the character switching signal generator 7 shows a level of "L", the base voltage of transistors 26 and 27 becomes lower than the base voltage of transistors 24 and 25.

Transistors 26 and 27 are turned off and transistors 24 and 25 are turned on, so that the signal from the character amplifier 23 is not applied bases of transistors 31 and 32. On the other hand, the base voltage of transistors 16 and 17 becomes higher than the base voltage of transistors 14 and 15 so that transistors 14 and 15 are turned off. Transistors 16 and 17 are, therefore, turned on to allow flow of their collector currents. The signal amplified by the main amplifier 13 is applied to bases of transistors 31 and 32. The signal is further amplified by the final stage amplifier 39 to display signal waveforms on the CRT 38.

As above-description, various characters and signal waveforms are switchingly displayed on the CRT 38 by the output from the character switching signal generator 71.

In the circuit of FIG. 1, the amplifier 101 employing the common-emitter connection and the final stage amplifier 39 are used in common in order to display signal waveforms and characters on the CRT 38.

In an amplifier of differential inputs employing the common-emitter connection, the location of circuit elements are symmetrical with respect to the input signal in order to eliminate influences of temperature variations and others. As voltages and currents of circuit elements with the balanced location vary in accordance with the level of the input signal, power dissipations of those elements vary so that those calorific values vary.

Temperature differences are, therefore, caused between those elements and operations of those elements having temperature coefficients are influenced by them. Accordingly, the signal amplified by those elements does not faithfully follow the input signal, but also a margin of error caused by their temperature coefficients is added on to the amplified signal.

This influence of the temperature coefficients causes a kind of drift on the CRT 38. For example, when two horizontal traces are displayed on the CRT 38, a trace of those is shifted up or down by turning a vertical positioning knob and the other trace is also drifted up or down in a little dimension although another vertical positioning knob is not turned. When signal waveforms and characters are simultaneously displayed on the CRT 38 by switching under control of the character switching signal generator 71, the same drift phenomena can be observed. The drift phenomena are caused by differences between levels of the signal waveforms and the signal of characters which are applied to the driving amplifier 101.

As characters need detailed display, when the drift phenomena cause fluctuations of characters on the CRT 38, characters are sometimes not readable.

In order to resolve such a problem, resistors have been appended between collectors of transistors 31, 32 and emitters of transistors 36, 37 respectively, to obtain a temperature balance in transistors 31, 32, 36 and 37.

Those appended resistors have, however, injured a dynamic range of amplifiers 101 and 39 in a high frequency range. Further, a resistor and a capacitor connected in series have been appended between emitters of transistors 31 and 32 to eliminate the drift phenomena by a time constant of the resistor and capacitor, however the sufficient elimination effects have not been obtained.

SUMMARY OF THE INVENTION

It is an object of the invention to provide a novel display circuit of an oscilloscope.

Another object of the invention is to provide a driftless display circuit.

A further object of the present invention is to provide a circuit for displaying clear characters and signal waveforms without fluctuations caused by drift phenomena.

The big source of fluctuations in displaying characters and signal waveforms comes from a driving amplifier and a final stage amplifier which are used in common to amplify character signals and waveform signals. Almost all the source of fluctuations comes from the driving amplifier. The final stage amplifier in the common-base connection has a current gain of less than 1, so that a gain difference between transistors 36 and 37 caused by a temperature difference between them causes substantially no fluctuations on the CRT.

The driving amplifier in the common-emitter connection has a large gain. A temperature difference between transistors 31 and 32 causes therefore a large gain difference to generate fluctuations on the CRT.

In the present invention, a driving amplifier to amplify character signals and waveform signals in common is not employed and two driving amplifiers to respectively amplify character signals and waveform signals are used. Those outputs of the two driving amplifiers are applied to the final stage amplifier to display clear characters and waveforms on the CRT.

BRIEF DESCRIPTION OF THE DRAWINGS

The principle, construction and operation of this invention will be clearly understood from the following detailed description with the accompanying drawings, in which.

DESCRIPTION OF THE PREFERRED EMBODIMENTS

Referring now to the drawings, wherein like reference characters designate like or corresponding parts throughout the figures.

Figure 2:
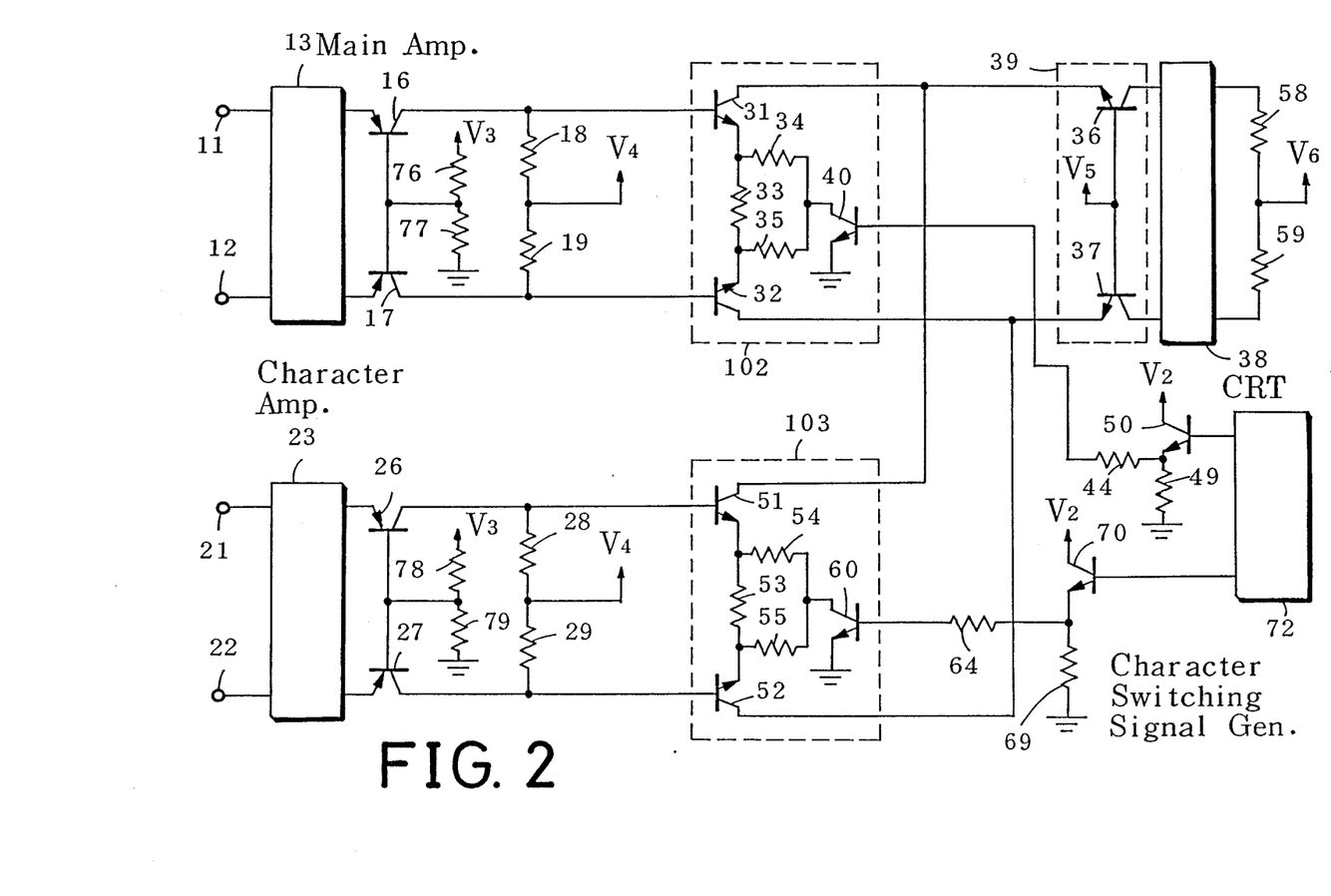
FIG. 2 is a circuit diagram showing an embodiment of this invention.

In FIG. 2 reference numeral 11 and 12 indicate signal input terminals. Each signal input terminal of 11 and 12 is applied a signal of a polarity reversed to each other from a prestage amplifier which is not shown therein.

Numeral 13 identifies a main amplifier which amplifies signals from input terminals 11 and 12. The amplified signals are applied to bases of transistors 31 and 32 which form the common-emitter circuit via transistors 16 and 17 forming the common-base circuit.

Bases of the transistors 16 and 17 are connected together to biasing resistors 76 and 77 which divide a voltage of a power supply $V_3$. Transistors 31 and 32, resistors 33, 34, and 35, and a transistor 40 for switching construct a driving amplifier 102 to drive a final stage amplifier 39 which consists of transistors 36 and 37 in the common-base connection for driving a CRT (a cathode-ray tube) 38. The resistor 33 is connected between emitters of transistors 31 and 32. The resisters 34 and 35 are respectively connected between emitters of transistors 31 and 32 and a collector of the transistor 40. A base of the transistor 40 is connected to an emitter of a transistor 50, which forms an emitter follower with a resistor 49, through a resistor 44.

The signal applied between bases of transistors 31 and 32 is amplified to be added to deflection plates (not shown) of the CRT 38 via transistors 36 and 37 so that signal waveforms are displayed on the CRT 38. Numerals 58 and 59 designate load resistors of the driving amplifier 102 and the final stage amplifier 39. Resistors 58 and 59 are connected to a power supply $V_6$. Bases of transistors 36 and 37 are connected together to power supply $V_5$ in order to be applied a bias voltage.

Numeral 21 and 22 indicate character input terminals. Each terminal 21 and 22 is applied a character signal of a polarity reversed to each other from a character signal generator which is not shown in FIG. 2. Numeral 23 identifies a character amplifier which amplifies the character signal from character input terminals 21 and 22. The character signal amplified by the character amplifier 23 is applied to bases of transistors 51 and 52 of a driving amplifier 103 which forms the common-emitter circuit through transistors 26 and 27 which forms the common-base circuit. Load resistors of the character amplifier 23 are resistors 28 and 29 connected to the power supply $V_4$. Bases of the transistors 26 and 27 are connected together to biasing resistors 78 and 79 which divide the voltage of the power supply $V_3$.

Transistors 51 and 52, resistors 53, 54 and 55, and a transistor 60 for switching construct a driving amplifier 103. A pair of outputs of the driving amplifier 103 is respectively applied to emitters of transistors 36 and 37 of the final stage amplifier 39. The resistor 53 is connected between emitters of transistors 51 and 52. The resistors 54 and 55 are respectively connected between emitters of transistors 51 and 52 and a collector of the transistor 60. A base of the transistor 60 is connected to an emitter of a transistor 70, which forms an emitter follower with a resistor 69, through a resistor 64.

The signal applied between bases of transistors 51 and 52 to be added to deflection plates (not shown) of the CRT 38 via transistors 36 and 37 so that various characters are displayed on the CRT 38.

Character switching signals which have polarities reverse to each other are generated from a character switching signal generator 72. Those character switching signals are respectively applied to bases of transistors 50 and 70, which form emitter followers with resistors 49 and 69.

Character switching signals are synchronously generated with timing signals added to the character switching signal generator 72 from a character signal generator not shown therein.

Character switching signals are applied to the bases of transistors 50 and 70 at levels of "H" or "L". When the level "H" is applied to the transistor 50 and the level of "L" is applied to the transistor 70, the transistor 40 is added the level of "H" to be turned on and currents flow through resistors 34 and 35, so that collector currents of transistors 31 and 32 flow, too. The signal amplified by the main amplifier 13 and transistors 16 and 17 can be amplified by the driving amplifier 102 and final stage amplifier 39. On the other hand, the transistor 60 is applied the level of "L" to be turned off and the currents can not flow through resistors 54 and 55 so that the character signal from the character amplifier 23 can not be amplified by the driving amplifier 103 in spite of the operation of the character amplifier 23 and transistors 26 and 27.

Accordingly, collector currents of transistors 31 and 32 flow through transistors 36 and 37 to display signal waveforms on the CRT 38.

When the level "L" is applied to the transistor 50 and the level of "H" is applied to the transistor 70, the transistor 60 is added the level of "H" to be turned on and currents flow through resistors 54 and 55, so that collector currents of transistors 51 and 52 flow, too. The character signal amplified by the character amplifier 23 and transistors 26 and 27 can be amplified by the driving amplifier 103 and final stage amplifier 39. On the other hand, transistor 40 is applied the level of "L" to be turned off and currents can not flow through resistors 34 and 35 so that the waveform signal from the main amplifier 13 can not be amplified by the driving amplifier 102 in spite of the operation of the main amplifier 13 and transistors 16 and 17.

Accordingly, only collector currents of transistors 51 and 52 flow through transistors 36 and 37 to display characters on the CRT 38.

As above-description, various characters and signal waveforms are switchingly displayed on the CRT 38 by the output from the character switching signal generator 72.

In the circuit shown in FIG. 1, the portion used in common to display signal waveforms and characters includes transistors 36 and 37 which form the common-base circuit and load resistors 58 and 59. The other transistors and resistors are however used not in common but separately. In order to display signal waveforms on the CRT 38, the driving amplifier 102 is exclusively used. In order to display characters on the CRT 38, the driving amplifier 103 is exclusively used, too. Both outputs of the driving amplifier 102 and 103 are added to the final stage amplifier 39 of which output is added to the CRT 38 to simultaneously display signal waveforms and characters.

Therefore, the drift phenomena by differences between levels of waveform signals and character signals can be eliminated, and clear characters and signal waveforms can be displayed without fluctuations.

The driving amplifier 103 is for amplifying only character signals. Accordingly, an amplifier, which has narrower bandwidth than driving amplifier 102, can be employed to reduce the cost of production.

Figure 3:
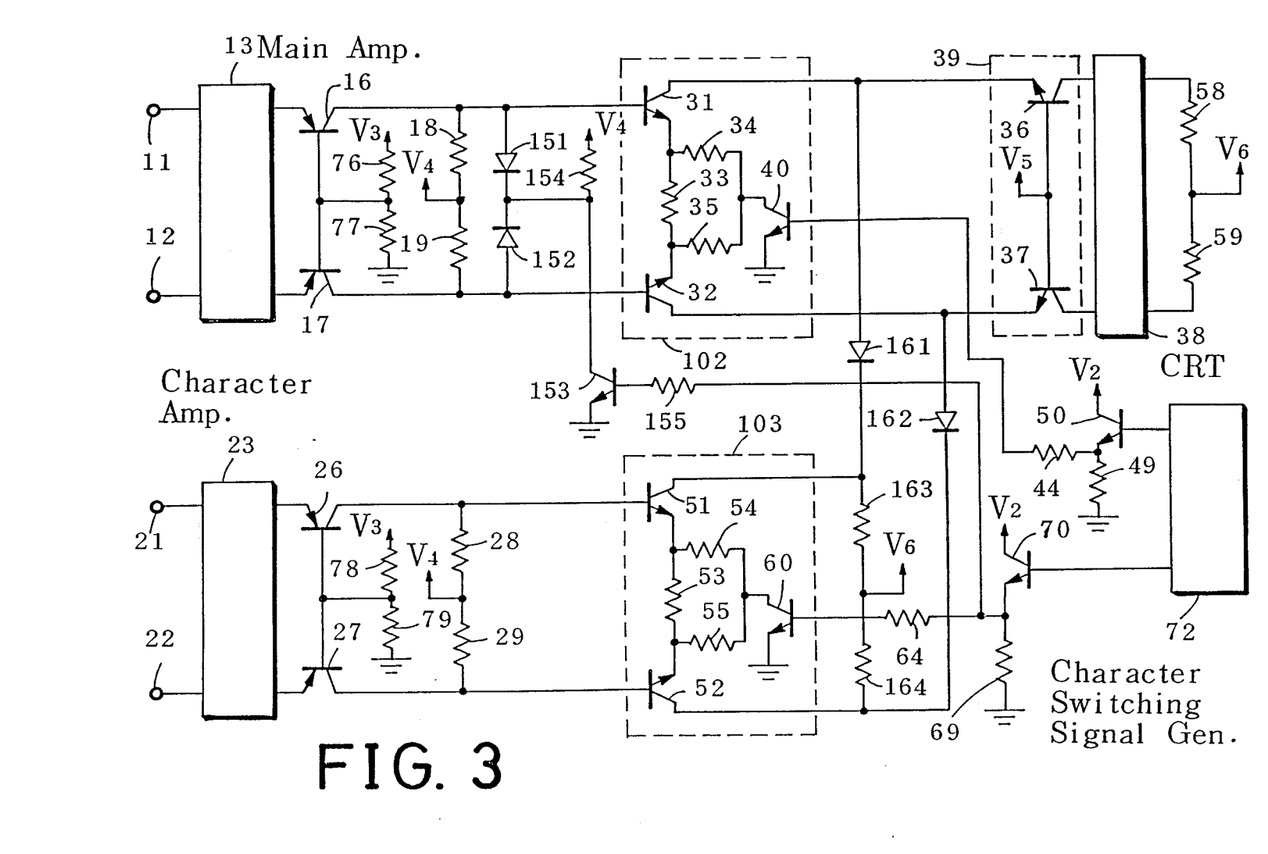
FIG. 3 is a circuit diagram showing another embodiment of this invention.

Another embodiment of the invention is shown in FIG. 3. It is the difference of this circuit shown in FIG. 3 from the same shown in FIG. 2 that diodes 151, 152, 161 and 162, a transistor 153, and resistors 154, 155, 163 and 164 are appended to the circuit of FIG. 2.

Anodes of diodes 151 and 152 are respectively connected to bases of transistors 31 and 32. Cathodes of diodes are connected together to a collector of the transistor 153 of which emitter is grounded. The collector is connected to the power supply $V_4$ through the resistor 154. A base of the transistor 153 is connected to the emitter of the transistor 70 via the resistor 155. Anodes of diodes 161 and 162 are respectively connected with emitters of transistors 36 and 37 and their cathodes are connected with collectors of transistors 51 and 52. Cathodes of diodes 161 and 162 are respectively connected to the power supply $V_6$ through resistors 163 and 164. The cathodes are connected to collectors of transistors 51 and 52, too.

When characters are displayed, transistors 60 and 153 are turned on and transistor 40 is turned off. Accordingly diodes 151, 152, 161 and 162 are turned on. Diodes 151 and 152 turned on show remarkably lower resistances than load resistors 18 and 19 to form a short circuit. As high frequency signals amplified in the main amplifier 13 are short-circuited, high frequency signals can not pass through capacitances between collectors and bases of transistors 31 and 32 which are turned off. Clear characters can therefore be displayed on the CRT 38 without fluctuations caused by signals from the main amplifier 13. Resistances of resistors 163 and 164 are sufficiently higher than resistors 58 and 59 in order to have no effect on the amplification factor of the driving amplifier 103 and the final stage amplifier 39.

When signal waveforms are displayed, transistors 60 and 153 are turned off and transistor 40 is turned on. Accordingly diodes 151, 152, 162 and 163 are turned off. Even if high frequency spectra of character signals amplified by the character amplifier 23 can pass through capacitances between collectors and bases of transistors 51 and 52, character signals have no effect on signal waveforms which displayed on the CRT 38, because diodes 161 and 162 turned off block off high frequency spectra of character signals.

In FIG. 2 and FIG. 3, transistors 16, 17, 26 and 27 of PNP type are exemplarily employed. They can however be replaced by NPN type as shown in FIG. 1. It is obvious in this case that voltages of power supply $V_3$ and $V_4$ must be suitably set.

Figure 4:
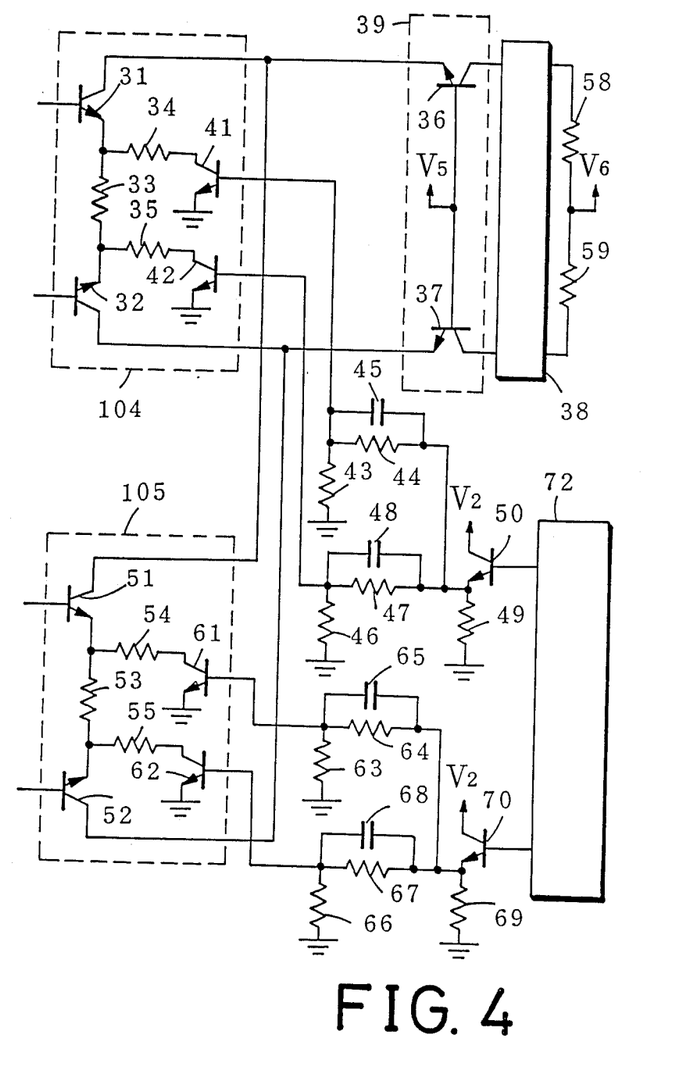
FIG. 4 is a circuit diagram showing another embodiment of this invention.

Another embodiment of the invention is shown in FIG. 4, in which different portions from the embodiment shown in FIG. 2 are illustrated. Corresponding circuit elements are denoted by the same reference numerals in both figures. Resistors 34 and 35 are, in FIG. 2 or 3, connected together to the collector of the transistor 40, however those resistor 34 and 35 are, in FIG. 4, respectively connected to collectors of transistors 41 and 42 of which emitters are grounded. Each collector current of transistors 41 and 42 is smaller than the same of the transistor 40 shown in FIG. 2. Their saturation voltages are smaller than the same the transistor 40, too. It is therefore possible that stabilities of performance, e.g. the common mode rejection ratio, in a driving amplifier 104 are improved and a load of a driving circuit for driving transistors 41 and 42 is reduced. In a driving amplifier 105 employing transistors 61 and 62, the same effects as above-description are obtainable.

An output of an emitter follower consisting of a transistor 50 and a resistor 49 is fed in parallel to bases of transistors 41 and 42 via dividers.

The divider for the transistor 41 consists of a resistor 44 connected with a capacitor 45 in parallel and a resistor 43. The capacitor 45 is for improvement of the switching speed of the transistor 41. Other dividers for the transistors 42, 61, and 62 include capacitors 48, 65 and 68 and resistors 46, 47, 63, 64, 66 and 67 and their effects are the same as the above-description.

Figure 5:
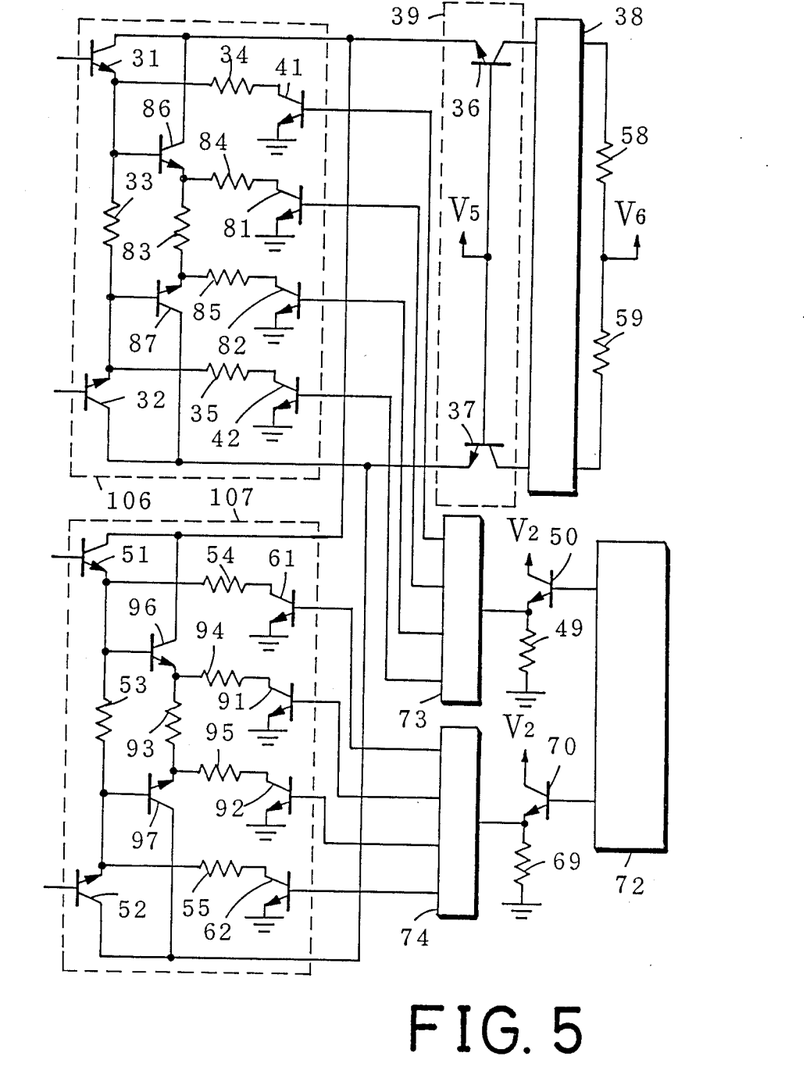
FIG. 5 is a circuit diagram showing another embodiment of this invention.

Another embodiment of the invention is shown in FIG. 5, in which different portions from the embodiment shown in FIG. 2, are illustrated. Corresponding circuit elements are denoted by the same reference numerals in both figures.

In FIG. 5, load resistors 58 and 59 of low impedance are employed in order to flow big currents. In a driving amplifier 106, transistors 81, 82, 86 and 87 and resistors 83, 84 and 85 are appended. Transistors 86 and 87 are employed in order to reduce loads of transistors 31 and 32 which form the common-emitter circuit.

Collectors of transistors 31 and 86 are connected together to an emitter of a transistor 36. Collectors of transistors 32 and 87 are connected together to an emitter of a transistor 37. Bases of transistors 86 and 87 are respectively connected to emitters of transistors 31 and 32. Collectors of transistors 41, 42, 81 and 82 for switching are respectively connected to emitters of transistors 31, 32, 86 and 87 through resistors 34, 35, 84 and 85. Bases of transistors 41, 42, 81 and 82 are respectively connected to a switch driver 73 which delivers character switching signals from an emitter of a transistor 50 to those bases. Buffer circuits or the like shown in FIG. 4 can be employed as the switch driver 73.

A driving amplifier 107 and a switch driver 74 correspond respectively to the driving amplifier 106 and the switch driver 73. The driving amplifier 107 includes transistors 51, 52, 96, 97, 61, 62, 91 and 92 and resistors 53, 93, 54, 55, 94 and 95.

Above-described circuits in from FIG. 2 to FIG. 5 can be combined in accordance with requirements.

It is obvious that fluctuation phenomena caused by switching waveform signals and character signals are eliminable in the invention. For example, when two horizontal traces are displayed and one trace is quickly moved by 8 divisions, in the circuit of the prior art shown in FIG. 1, another trace drifts by 0.2 divisions. On the other hand, in the circuit of this invention, the drift of another trace is only 0.01 divisions so that clear characters can be displayed without fluctuations.

A narrowband amplifier can be used enough in order to amplify character signals. Accordingly, the invention is for not only wideband oscilloscope but also narrowband oscilloscope. It is not only inexpensive but also improveable in qualities of oscilloscopes to employ the circuit of the invention.

It is to be understood that the invention is not limited in its application to the details of construction and arrangement of devices illustrated in the accompanying drawings, since the invention is capable of other embodiments and of being practiced or carried out in various ways. Also it is to be understood that the phraseology or terminology employed herein is for the purpose of description and not of limitation.

What is claimed is:
1. A display circuit of an oscilloscope comprising:
   a final stage amplifier which forms a balanced common-base circuit, for amplifying waveform signals and character signals to be applied to deflection plates of a cathode-ray tube;
   a first driving amplifier, which forms a first balanced common-emitter circuit, for amplifying said waveform signals to alternately drive said final stage amplifier to which output signals of said first driving amplifier are directly applied; and
   a second driving amplifier, which forms a second balanced common-emitter circuit, for amplifying said character signals to drive said final stage amplifier when said first driving amplifier does not drive said final stage amplifier.

2. A display circuit of an oscilloscope comprising:
   a final stage amplifier, which forms a balanced common-base circuit, for amplifying waveform signals and character signals to be applied to deflection plates of a cathode-ray tube;
   a first driving amplifier, which forms a first balanced common-emitter circuit, for amplifying said waveform signals to alternately drive said final stage amplifier to which output signals of said first driving amplifier are directly applied;
   a short circuit means for short-circuiting input signals of said first driving amplifier so as not to be amplified thereby when said first driving amplifier does not drive said final stage amplifier; and
   a second driving amplifier, which forms a second balanced common-emitter circuit, for amplifying said character signals to drive said final stage amplifier through switching devices in which said switching devices can be turned on when said first driving amplifier does not drive said final stage amplifier.

3. A display circuit of an oscilloscope as claimed in claim 1 or 2, wherein;
   said first driving amplifier comprises a first switching transistor of which emitter is grounded to turn off or on currents through resistors which are connected between a collector of said first switching transistor and emitters of transistors constructing said first balanced common-emitter circuit, and said second driving amplifier comprises a second switching transistor of which emitter is grounded to turn off or on currents through resistors which connected between a collector of said second switching transistor and emitters of transistors constructing said second balanced common-emitter circuit.

4. A display circuit of an oscilloscope as claimed in claim 1 or 2, wherein;

said first driving amplifier comprises each first switching transistor of which emitter is grounded to turn off or on a current through each resistor which is connected between a collector of said each first switching transistor and an emitter of each transistor constructing said first balanced common-emitter circuit, and said second driving amplifier comprises each second switching transistor of which emitter is grounded to turn on or off a current through each resistor which is connected between a collector of said each second switching transistor and an emitter of each transistor constructing said second balanced common-emitter circuit.

* * * * *